US009391609B2

(12) United States Patent
Lee et al.

(10) Patent No.: US 9,391,609 B2
(45) Date of Patent: Jul. 12, 2016

(54) TOUCH DEVICE AND FABRICATION METHOD THEREOF

(71) Applicant: TPK Touch Solutions (Xiamen) Inc., Xiamen (CN)

(72) Inventors: Yuh-Wen Lee, Hsinchu (TW); Ho-Hsun Chi, Hsinchu (TW); Lichun Yang, Xiamen (CN); Huilin Ye, Xiamen (CN); Fanzhong Zhang, Xiamen (CN)

(73) Assignee: TPK Touch Solutions (Xiamen) Inc., Xiamen (CN)

( * ) Notice: Subject to any disclaimer, the term of this patent is extended or adjusted under 35 U.S.C. 154(b) by 113 days.

(21) Appl. No.: 14/067,953

(22) Filed: Oct. 31, 2013

(65) Prior Publication Data

US 2014/0124352 A1    May 8, 2014

(30) Foreign Application Priority Data

Nov. 2, 2012    (CN) .......................... 2012 1 0436012

(51) Int. Cl.
*G06F 3/041* (2006.01)
*H03K 17/96* (2006.01)
*G06F 3/044* (2006.01)

(52) U.S. Cl.
CPC .............. *H03K 17/962* (2013.01); *G06F 3/044* (2013.01); *G06F 2203/04103* (2013.01); *G06F 2203/04111* (2013.01); *H03K 2217/960755* (2013.01); *Y10T 29/49105* (2015.01)

(58) Field of Classification Search
CPC ....... H01H 1/64; H01H 11/04; H03K 17/962; H03K 17/96; H03K 2217/960755; G06F 3/041; G06F 3/044; G06F 2203/04103; G06F 2203/04111; Y10T 29/49105
USPC .............. 174/255; 345/173; 200/600; 29/622
See application file for complete search history.

(56) References Cited

U.S. PATENT DOCUMENTS

2012/0327004 A1* 12/2012 Mikladal ................. G06F 3/044
                                                         345/173
2013/0135241 A1* 5/2013 Wu et al. ......................... 345/173
2013/0141380 A1* 6/2013 Wang ..................... G06F 3/041
                                                         345/173

FOREIGN PATENT DOCUMENTS

KR      101160811 B1    6/2012
TW      M388686         9/2010

* cited by examiner

*Primary Examiner* — Timothy Thompson
*Assistant Examiner* — Guillermo Egoavil
(74) *Attorney, Agent, or Firm* — Gokalp Bayramoglu; Paul Bendamire

(57) ABSTRACT

A touch device is provided. The touch device includes a decorative layer formed on at least one side of a sensing electrode layer and disposed for corresponding to the sensing electrode layer to constitute a vacant space, a signal-conveying trace disposed on the decoration layer, an insulating layer formed to fill the vacant space, and a conductive layer formed on the insulating layer and bridging over the sensing electrode layer and the decorative layer through the buffer function of the insulating layer for electrically connecting the sensing electrode layer with the signal-conveying trace. Further, a method for fabricating the touch device is also provided.

22 Claims, 11 Drawing Sheets

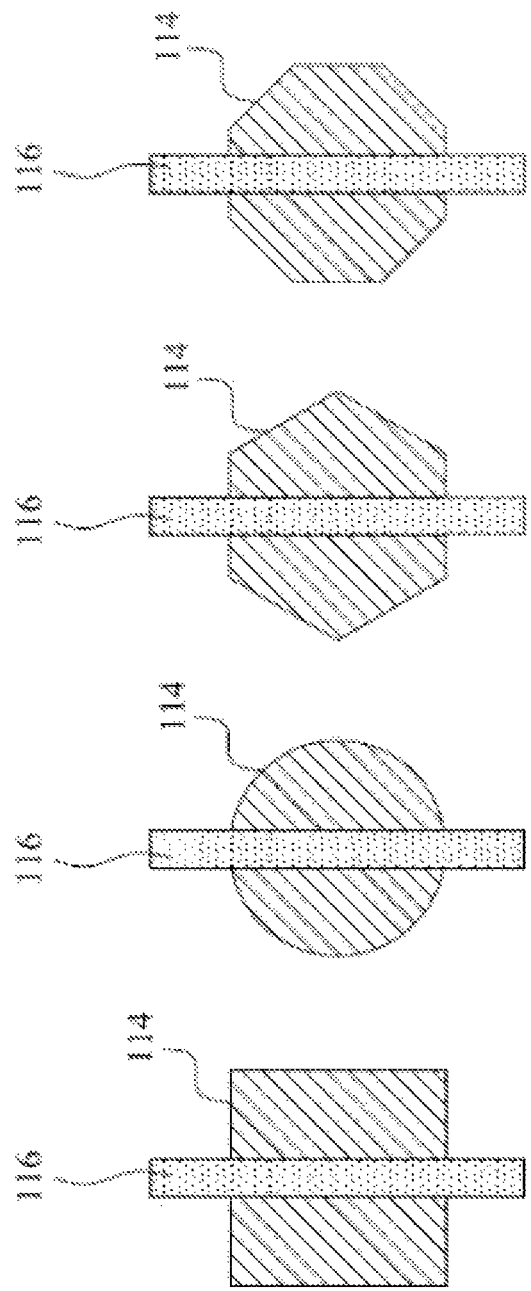

TOUCH DEVICE AND FABRICATION METHOD THEREOF

This Application claims priority of the People's Republic of China Patent Application No. CN201210436012.X, filed on Nov. 2, 2012, the entirety of which is incorporated by reference herein.

BACKGROUND OF THE INVENTION

1. Field of the Invention

The present invention relates to touch device technology, and in particular to a touch device and fabrication method thereof.

2. Description of the Related Art

Recently, touch devices have been popularly applied in various electronic products, such as mobile phones, personal digital assistants (PDA) and handheld personal computers. Currently, a design scheme has been developed in which the touch devices being manufactured are increasingly thin. The thin touch device includes a cover lens and touch-sensing elements, wherein the touch-sensing elements are directly formed on one side of the cover lens, and the other side of the cover lens is provided for users to be able to touch in order to input signals or control the electronic product. Therefore, the cover lens has both its original function of protection and a new function for carrying the touch-sensing elements. An original substrate of conventional touch devices for carrying the touch-sensing elements can be omitted. The thin touch devices have the advantages of being light in weight and having a thin profile, and thus these thin touch devices are gradually being favored by more and more consumers.

In the thin touch devices, firstly, a decorative layer is formed on the cover lens to define a peripheral area. Another area inside the peripheral area is usually defined as a viewable area. Then, a transparent electrode layer is formed on the cover lens to be used for a touch-sensing electrode. The transparent electrode layer extends from the viewable area to the peripheral area and over the decorative layer. Next, a signal-conveying trace is formed on the decorative layer to be in direct contact with the transparent electrode layer. Therefore, an electrical signal produced from the touch-sensing electrode is transmitted to an external detection circuit through the signal-conveying trace, and a touch-position is determined by the external detection circuit.

Because the decorative layer usually has a thickness of several micrometers (μm) to several tens of micrometers, the transparent electrode layer needs to straddle a step structure with a height of several micrometers (μm) to several tens of micrometers for extending from the viewable area to be on the decorative layer at the peripheral area. Thus, it is difficult to form the transparent electrode layer, and the step-covering ability of the transparent electrode layer on the decorative layer is reduced by an increase of the thickness of the decorative layer. It causes the transparent electrode layer to break easily, and the reliability of the electrical connection between the transparent electrode layer and the signal-conveying trace is thereby reduced.

BRIEF SUMMARY OF THE INVENTION

According to embodiments of the disclosure, the structures of touch device and fabrication method thereof are modified. An insulating layer is firstly formed to fill a vacant space constituted by a decorative layer and a sensing electrode layer. Then, a conductive layer is formed on the insulating layer to be a bridge straddling the sensing electrode layer and the decorative layer by using the insulating layer as a buffer. The bridge style of the conductive layer is used for electrically connecting the sensing electrode layer and a signal-conveying trace on the decorative layer. The insulating layer formed under the conductive layer is used as a buffer layer or a transitional layer having the height required for the conductive layer to straddle onto the decorative layer. Through the designs of the structures of the conductive layer and the insulating layer of the embodiments of the present disclosure, the problem of reduced reliability of the electrical connection between the transparent electrode layer and the signal-conveying trace in conventional touch devices as mentioned above is overcome.

According to embodiments of the disclosure, a touch device is provided. The touch device includes a sensing electrode layer and a decorative layer formed on at least one side of the sensing electrode layer, wherein the decorative layer is disposed for corresponding to the sensing electrode layer to constitute a vacant space. A signal-conveying trace is disposed on the decorative layer. An insulating layer is formed to fill the vacant space. Furthermore, a conductive layer is formed on the insulating layer and bridging over the sensing electrode layer and the decorative layer through the buffer function of the insulating layer for electrically connecting the sensing electrode layer with the signal-conveying trace.

According to embodiments of the disclosure, a method for fabricating a touch device is also provided. The method includes forming an insulating layer to fill a vacant space constituted by disposing a decorative layer to correspond to a sensing electrode layer; and forming a conductive layer on the insulating layer, wherein the conductive layer bridges over the sensing electrode layer and the decorative layer through the buffer function of the insulating layer for electrically connecting the sensing electrode layer with a signal-conveying trace formed on the decorative layer.

In the touch devices of the disclosure, the insulating layer disposed under the conductive layer can be used as a buffer layer or a transitional layer having the height required for the conductive layer to straddle onto the decorative layer. Thus, it is easy to form the conductive layer in such a manner as to bridge over the sensing electrode layer and the decorative layer, and the formed conductive layer is not easily broken or damaged. The reliability of the electrical connection between the sensing electrode layer and the signal-conveying trace is thereby enhanced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 7A-7D show various shapes of an insulating layer according to several embodiments of the present disclosure;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In the accompanying drawings, in order to clearly illustrate the characteristics of the embodiments of the invention, each element in the touch devices may not be drawn to scale. Moreover, in the descriptions that follow, the orientations of "on", "over", "above", "under" and "below" are used for representing the relationship between the relative positions of each element in the touch device, and are not used to limit the present disclosure. However, in an actual application of the touch device, the protection cover 100 is disposed at the top of the touch device for users.

Figure 1:
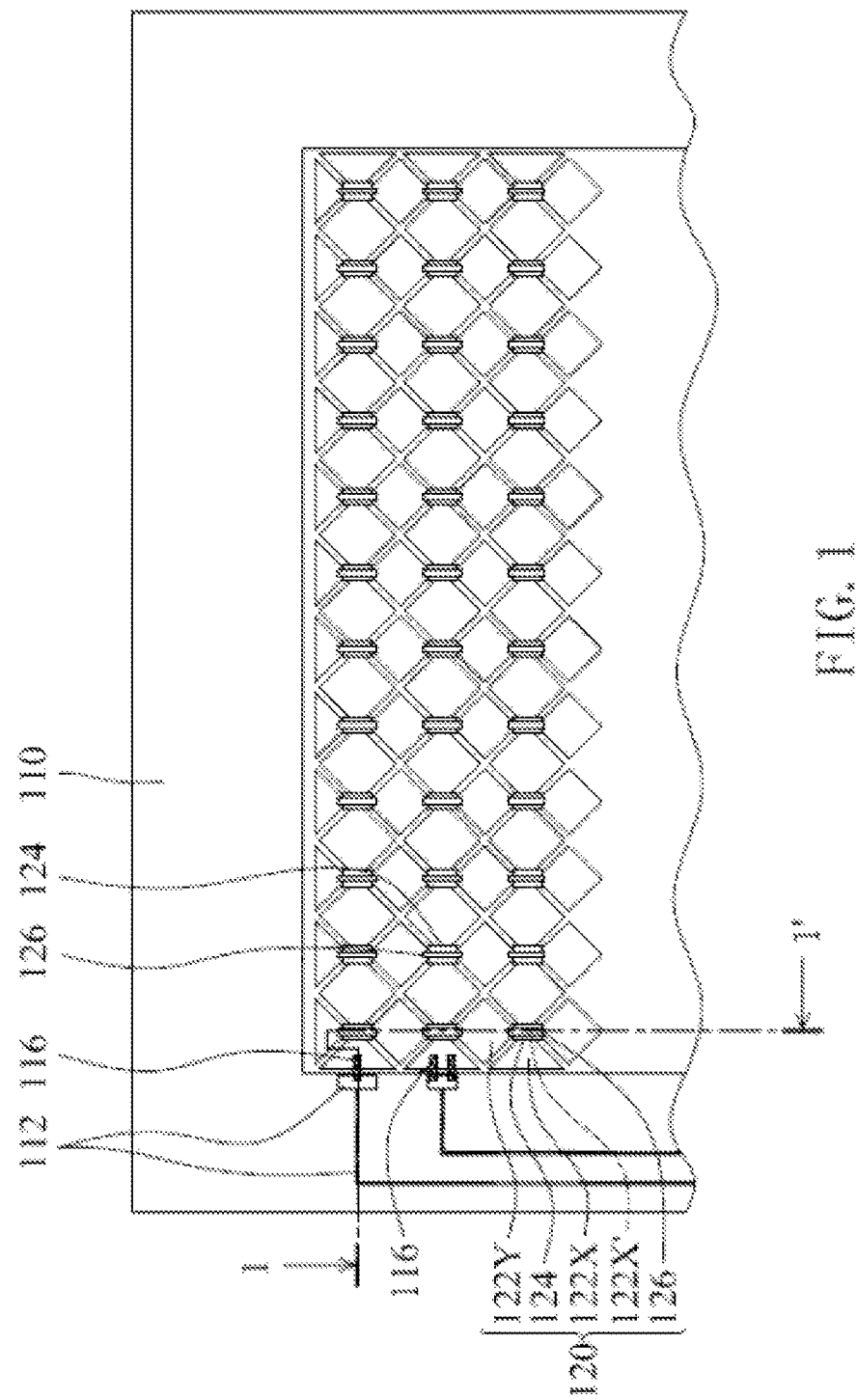
FIG. 1 shows an illustrative partial plane view of a touch device according to an embodiment of the present disclosure.
Figure 2:
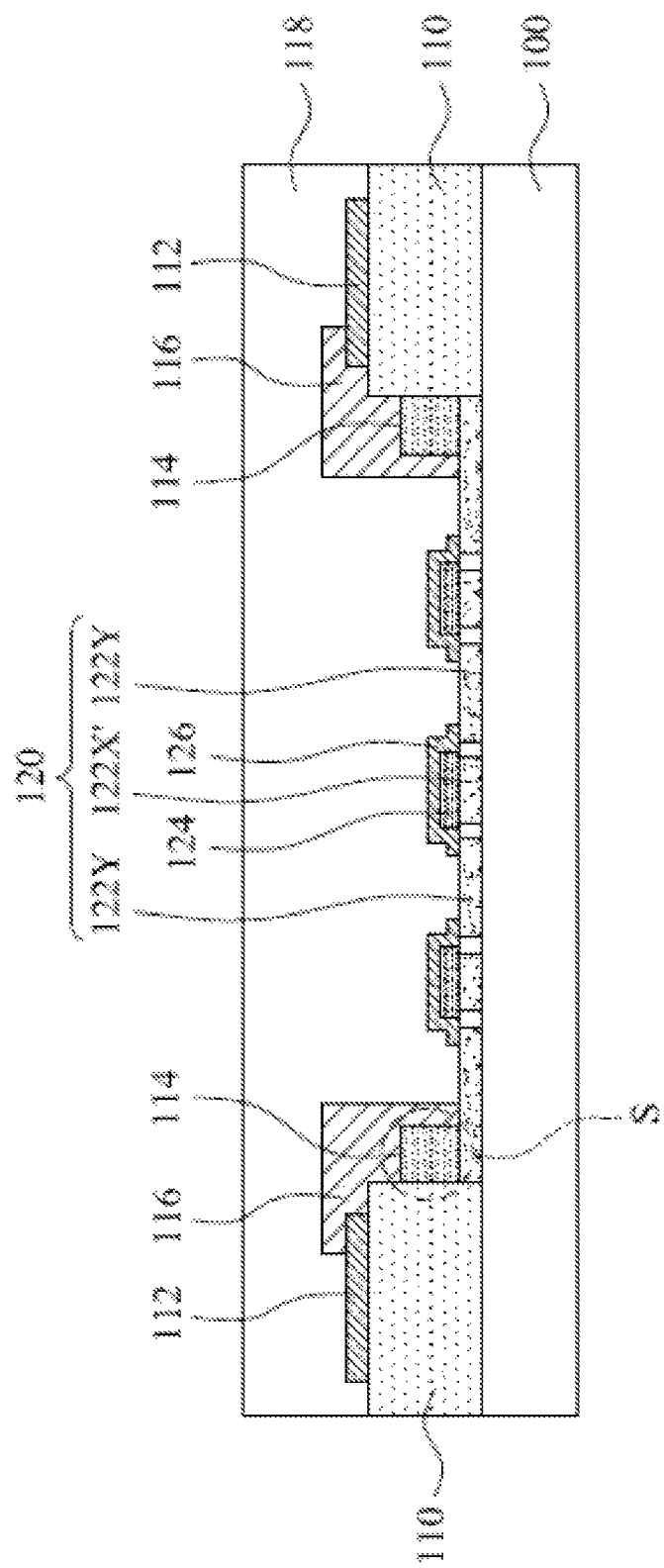
FIGS. 2-5 show illustrative cross-sections of touch devices according to several embodiments of the present disclosure.

Referring to FIG. 1 and FIG. 2, FIG. 1 shows an illustrative partial plane view of a touch device according to an embodiment of the present disclosure, and FIG. 2 shows an illustrative cross-section of a touch device along cross-section line 1-1' of FIG. 1 according to an embodiment of the disclosure. The touch device can be a capacitive touch device and has a touch structure wherein all touch elements are disposed on the inner surface of the protection cover 100. The outside surface of the protection cover 100 is used as the touch side of the touch device. The material of the protection cover 100 is, for example, tempered glass.

A sensing electrode layer 120 is disposed on the inner surface of the protection cover 100. The sensing electrode layer 120 includes a plurality of first sensing electrodes arranged along a first-axial direction, for example the X-axis, wherein each of the first sensing electrodes includes a plurality of first conductive units 122X and a plurality of connection lines 122X' for electrically connecting any two adjacent first conductive units 122X in the first-axial direction. The sensing electrode layer 120 further includes a plurality of second sensing electrodes arranged along a second-axial direction, for example the Y-axis, wherein each of the second sensing electrodes includes a plurality of second conductive units 122Y and a plurality of jumpers 126 for electrically connecting any two adjacent second conductive units 122Y in the second-axial direction. The jumpers 126 and the connection lines 122X' crisscross. Moreover, the sensing electrode layer 120 further includes a plurality of electrical isolation structures 124. The electrical isolation structures 124 are individually disposed between each of the connection lines 122X' and each of the jumpers 126 which are crisscrossed to prevent a short circuit from occurring between the first sensing electrodes arranged along the first-axial direction, for example the X-axis, and the second sensing electrodes arranged along the second-axial direction, for example the Y-axis. In an embodiment, the structure and pattern of each element of the sensing electrode layer 120 can be formed by a deposition, photolithography and etching process.

Furthermore, the size of each element of the sensing electrode layer 120 is illustrated. In one embodiment, if the first conductive units 122X, the connection lines 122X', the second conductive units 122Y and the jumpers 126 of the sensing electrode layer 120 are fabricated using an indium tin oxide (ITO) material, the thicknesses of the above elements are about several tens of nanometers (nm), and the thickness of the electrical isolation structures 124 is about 1 micrometer (μm).

In an embodiment, a decorative layer 110 is formed on at least one side of the sensing electrode layer 120 to adjacently contact to the sensing electrode layer 120. As shown in the embodiment of FIG. 2, the decorative layer 110 is illustrated by an example of surrounding the sensing electrode layer 120 and being disposed on the inner surface of the protection cover 100. Moreover, a signal-conveying trace 112 is further formed on the decorative layer 110. According to the embodiments of the disclosure, the decorative layer 110 can be a black, a white or a colored decorative layer, or a combination thereof. The black decorative layer has a thickness of about 2 μm to about 10 μm. The white and the colored decorative layer each have a thickness of about 30 μm. The material of the black decorative layer may be a black photoresist or black printing ink. The materials of the white and the colored decorative layer are white printing ink and colored printing ink, respectively.

According to the structure of the touch device and the sizes of the thicknesses of the elements as per the above illustration of this embodiment, there is a vacant space S constituted between the decorative layer 110 and the sensing electrode layer 120 due to the difference in thickness between the decorative layer 110 and the sensing electrode layer 120. As shown in FIG. 1, the portions of the sensing electrode layer 120 adjacent to the decorative layer 110 are usually the first conductive units 122X and the second conductive units 122Y. Therefore, the difference in the thickness between the decorative layer 110 and the first conductive units 122X and the second conductive units 122Y is more striking. Furthermore, according to the embodiment, an insulating layer 114 is formed to fill the vacant space S and then a conductive layer 116 is formed on the insulating layer 114. The conductive layer 116 is formed as a bridge over the sensing electrode layer 120 and the decorative layer 110 through the buffer function of the insulating layer 114 for electrically connecting the sensing electrode layer 120 with the signal-conveying trace 112 on the decorative layer 110. In the embodiment, the conductive layer 116 is formed after forming the signal-conveying trace 112, such that the conductive layer 116 stretches from the sensing electrode layer 120 onto the signal-conveying trace 112. Next, a protection layer 118 is formed to completely cover the touch elements on the protection cover 100, such as the sensing electrode layer 120, the insulating layer 114, the conductive layer 116, the signal-conveying trace 112 and the decorative layer 110.

According to the embodiment, the insulating layer 114 is formed to fill the vacant space S constituted of the decorative layer 110 and the sensing electrode layer 120. Then, the conductive layer 116 is formed on the insulating layer 114 for electrically connecting the sensing electrode layer 120 to the signal-conveying trace 112 on the decorative layer 110. As a result thereof, the structure of the touch device is improved, which can avoid the issue of conventional touch devices having a transparent electrode layer directly straddling the decorative layer. Therefore, the reliability of the electrical connection between the sensing electrode layer 120 and the signal-conveying trace 112 is effectively enhanced by an improved structure of the touch device of the disclosure. Moreover, in the embodiment, while forming the conductive layer 116, the disadvantage wherein the conductive layer 116 does not easily straddle onto the high decorative layer 110 can be overcome through the design of the insulating layer 114, making the conductive layer 116 resistant to breakage and damage. In other words, the insulating layer 114 of the embodiment can be used as a buffer layer or a transition layer having the height required for the conductive layer 116 to straddle onto the decorative layer 110.

Furthermore, as shown in FIG. 1, the pattern of the conductive layer 116 can be designed into one strip or a plurality of strips. In addition, as shown in FIG. 2, a portion of the conductive layer 116 overlaps with the signal-conveying trace 112. The overlap between the conductive layer 116 and the signal-conveying trace 112 is disposed above the signal-conveying trace 112.

Figure 3:
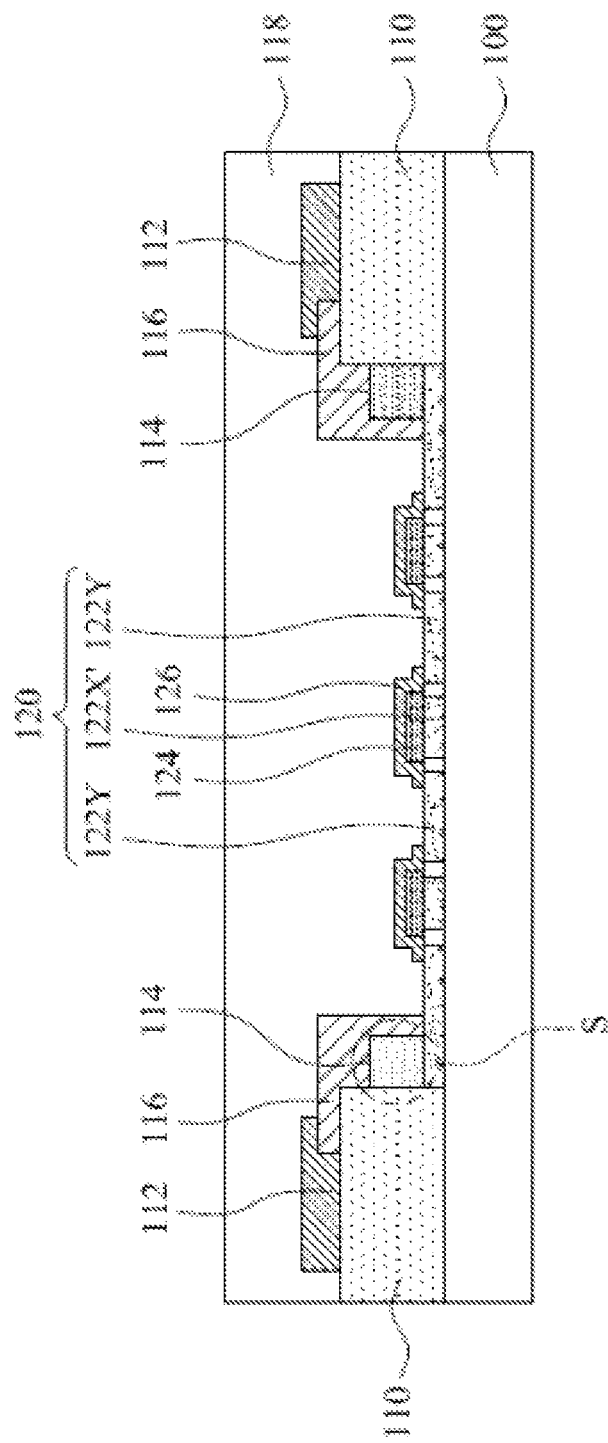

Referring to FIG. 3, a cross-section of a touch device according to another embodiment of the disclosure is shown. The structure of the embodiment of FIG. 3 is almost the same as that of FIG. 2. The difference between the embodiments of FIG. 3 and FIG. 2 is that the signal-conveying trace 112 of the embodiment of FIG. 3 is formed after forming the conductive layer 116. Thus, in the embodiment of FIG. 3, the conductive layer 116 is disposed between the insulating layer 114 and the signal-conveying trace 112, and the signal-conveying trace 112 stretches onto the conductive layer 116. The overlap between the conductive layer 116 and the signal-conveying trace 112 is disposed under the signal-conveying trace 112. In this structure, the sensing electrode layer 120 can also be electrically connected to the signal-conveying trace 112 through the conductive layer 116. In the same way, in the embodiment, the insulating layer 114 is also formed to fill the vacant space S constituted between the decorative layer 110 and the sensing electrode layer 120. The insulating layer 114 is used as a buffer layer or a transition layer having the height required for the conductive layer 116 to straddle onto the decorative layer 110.

Figure 4:
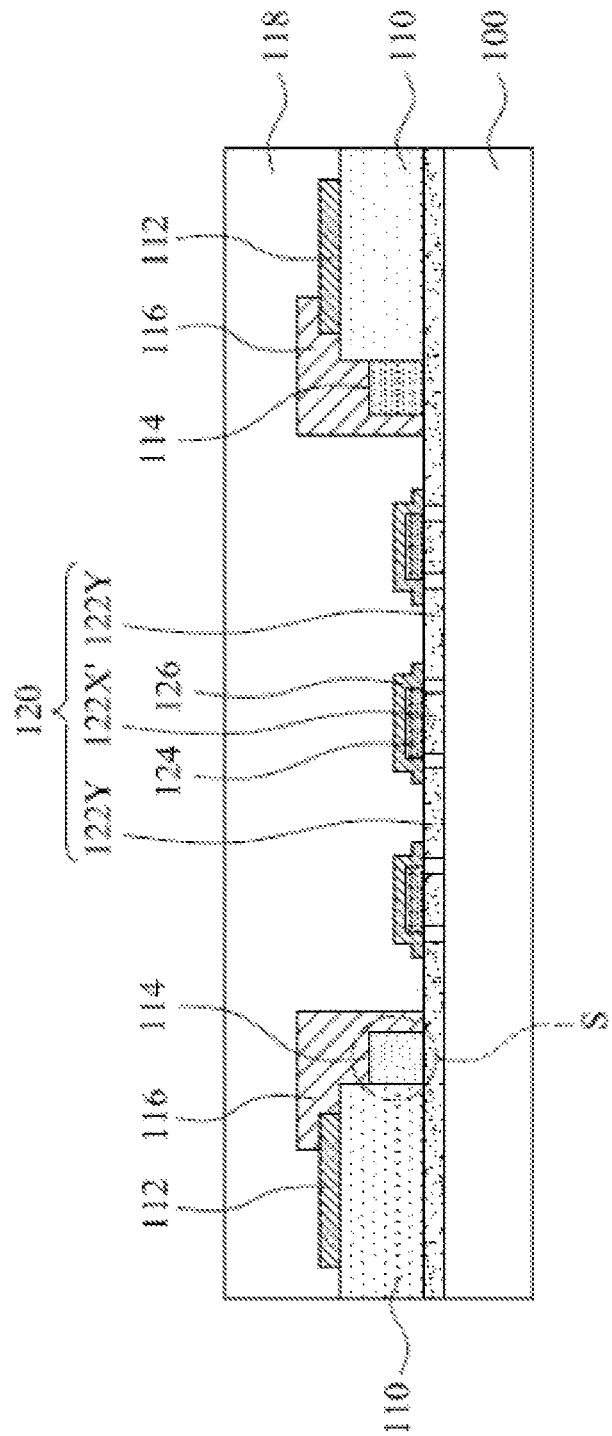
Figure 5:
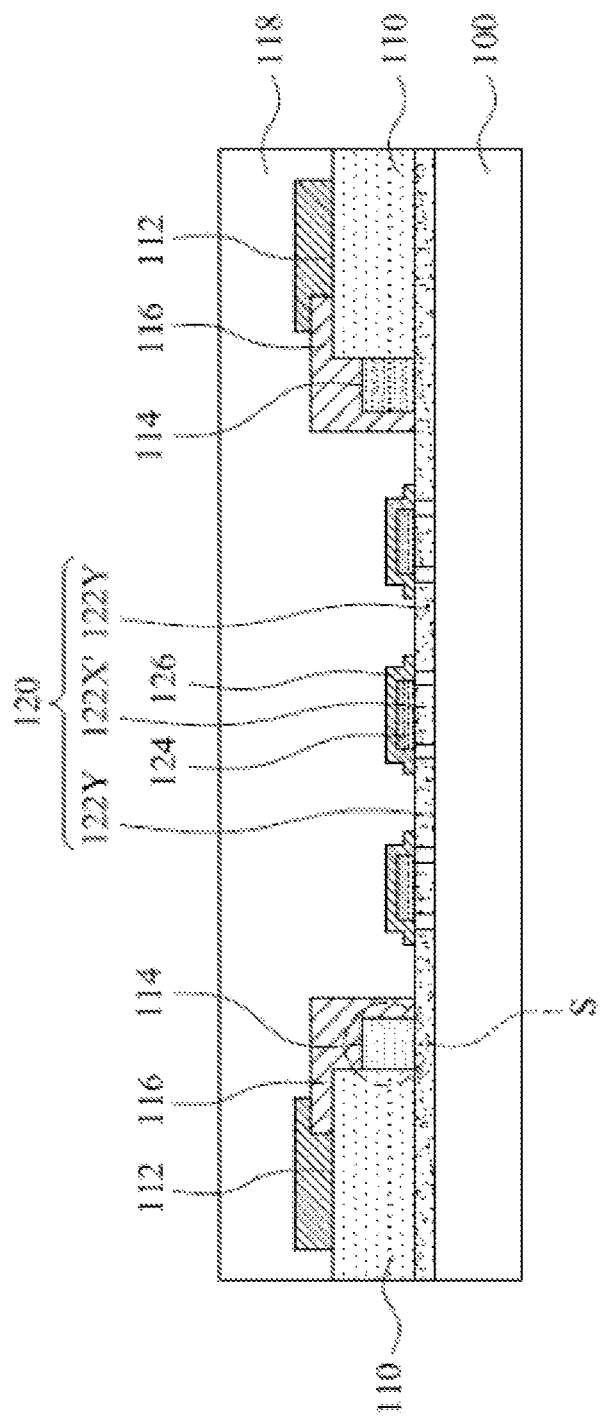
Figure 6D:
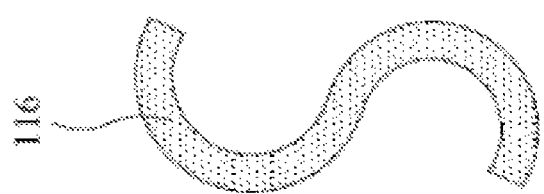
FIGS. 6A-6D show various shapes of a conductive layer according to several embodiments of the present disclosure.
Figure 6C:
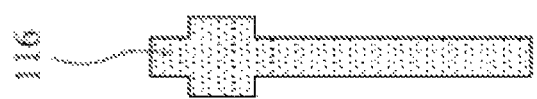
Figure 6B:
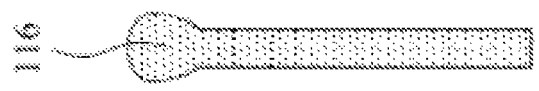
Figure 6A:
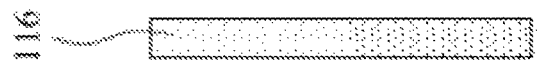

FIG. 4 and FIG. 5 show cross-sections of touch devices according to other embodiments of the disclosure. The structure of the embodiments of FIG. 4 and FIG. 5 are almost the same as that of FIG. 2 and FIG. 3. The difference between the embodiments of FIGS. 4-5 and FIGS. 2-3 is that in the processes for fabricating the embodiments of FIG. 4 and FIG. 5, the sensing electrode layer 120 is firstly formed and then the decorative layer 110 is formed. As a result, the decorative layer 110 is formed to overlap above the sensing electrode layer 120 and on at least one side of the sensing electrode layer 120. However, according to the structure of the embodiments of FIG. 4 and FIG. 5, a vacant space S formed between the decorative layer 110 and the sensing electrode layer 120 is constituted by the thickness of the decorative layer 110. In the same way, in these embodiments, the insulating layer 114 is also formed to fill the vacant space S. The insulating layer 114 is used as a buffer layer or a transition layer having the height required for the conductive layer 116 to straddle onto the decorative layer 110. The conductive layer 116 over the insulating layer 114 is formed as a bridge style through a buffer structure provided from the insulating layer 114. In the embodiment of FIG. 4, the conductive layer 116 is formed after forming the signal-conveying trace 112. In the embodiment of FIG. 5, the conductive layer 116 is formed before forming the signal-conveying trace 112.

Referring to FIGS. 6A-6D, various shapes of the strips of the conductive layer 116 according to some embodiments of the disclosure are shown. The shape of one strip of the conductive layer 116 can be rectangle, round-head dumbbell shape, rectangular-head dumbbell shape, S-shape, or another suitable shape. Moreover, the shapes of several strips of the conductive layer 116 can be a combination of rectangle, round-head dumbbell shape, rectangular-head dumbbell shape, S-shape, and other suitable shapes.

Referring to FIGS. 7A-7D, various shapes of the insulating layer 114 according to some embodiments of the disclosure are shown. The shape of the insulating layer 114 can be rectangle, circle, hexagon, octagon, or another suitable shape. Furthermore, the insulating layer 114 can be a one-layered structure or a multi-layered stack structure. Therefore, the shape of the insulating layer 114 can be a combination of rectangle, circle, hexagon, octagon and other suitable shapes.

In addition, although the conductive layer 116 as shown in FIGS. 7A-7D is a pattern of one strip formed on the insulating layer 114, the conductive layer 116 can also be designed into a pattern of several strips as shown in FIG. 1.

Figure 8:
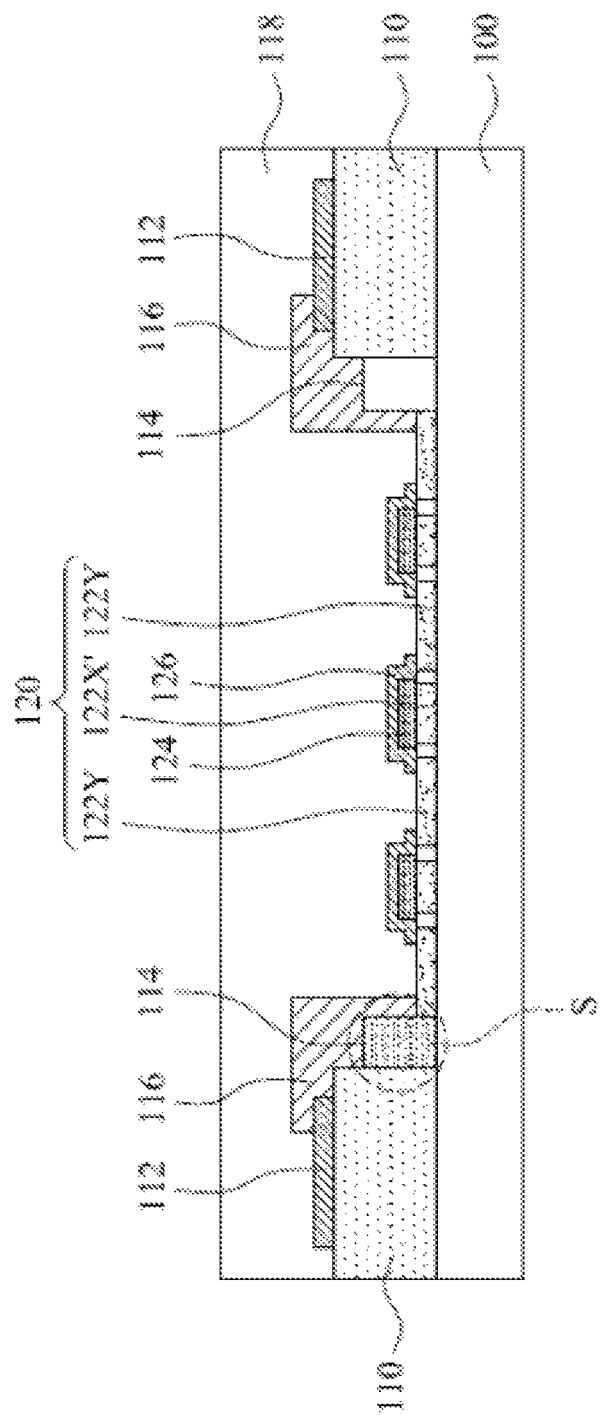
FIG. 8 shows illustrative cross-sections of touch devices according to another embodiments of the present disclosure.

Referring to FIG. 8, a cross-section of a touch device according to another embodiment of the disclosure is shown. The structure of the embodiment of FIG. 8 is almost the same as that of FIG. 2. The difference between the embodiments of FIG. 8 and FIG. 2 is that the decorative layer 110 of the embodiment of FIG. 8 is formed on at least one side of the sensing electrode layer 120 to be adjacent to the sensing electrode layer 120, and the decorative layer 110 and the sensing electrode layer 120 are separated by an interval. In other words, the vacant space S of the present embodiment constituted between the decorative layer 110 and the sensing electrode layer 120 is further located in the interval. In detail, the insulating layer 114 of the present embodiment is formed on the surface of the protection cover 100 to fill the vacant space S. The conductive layer 116 and the first conductive units 122X, the second conductive units 122Y of the sensing electrode layer 120 are formed of the same material and formed by the same process, so that the conductive layer 116 and the sensing electrode layer 120 are integrally formed.

In the embodiments of the disclosure, the material of the conductive layer 116 can be a metal or a transparent conductive material. Moreover, the jumpers 126 on the electrical isolation structures 124 can also be formed of a metal or a transparent conductive material. Therefore, according to an embodiment of the disclosure, the material of the conductive layer 116 can be the same as the material of the jumpers 126. Moreover, the conductive layer 116 can be formed by the process of forming the jumpers 126 at the same time. In other words, the conductive layer 116 and the jumpers 126 can be formed in the same step, so as to let the conductive layer 116 and the sensing electrode layer 120 be integrally formed. Thus, the forming of the conductive layer 116 does not add additional steps to the process or increase the fabrication cost of the touch devices.

Furthermore, in the embodiments of the disclosure, the signal-conveying trace 112 is formed from a metal material. Therefore, according to an embodiment of the disclosure, the signal-conveying trace 112, the conductive layer 116 and the jumpers 126 can be formed from the same metal material. Moreover, the signal-conveying trace 112, the conductive layer 116 and the jumpers 126 can be formed in the same step. For example, the signal-conveying trace 112, the conductive layer 116 and the jumpers 126 can be formed by a deposition, photolithography and etching process at the same time.

According to one embodiment of the disclosure, the material of the insulating layer 114 can be the same as the material of the electrical isolation structures 124 of the sensing electrode layer 120, such as an organic or an inorganic insulating material. The organic insulating material can be polyimide, which can be patterned by a photolithography or printing process. The insulating layer 114 and the electrical isolation structures 124 can be formed in the same step. Thus, the forming of the insulating layer 114 does not add additional steps to the process or increase the fabrication cost of the touch devices.

Figure 9:
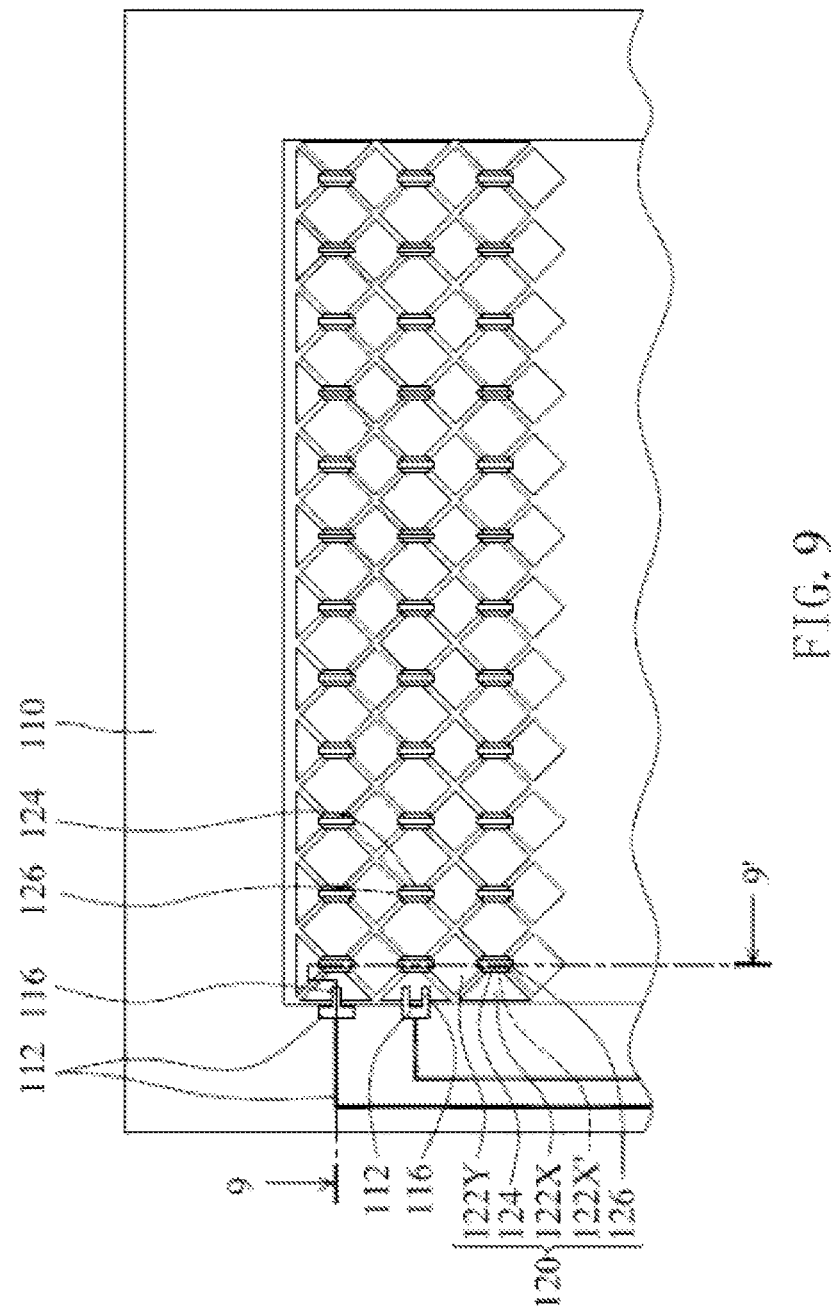
FIG. 9 shows an illustrative partial plane view of a touch device according to another embodiment of the present disclosure.
Figure 10:
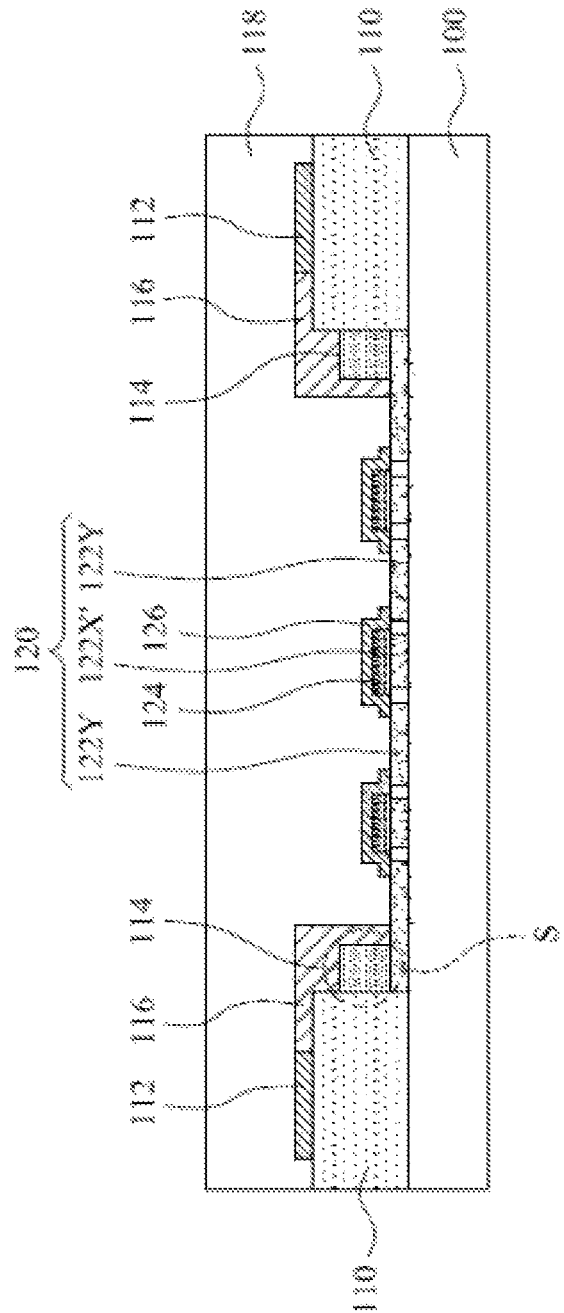
FIG. 10 shows an illustrative cross-section of a touch device along the cross-section line 9-9' of FIG. 9 according to an embodiment of the present disclosure.

Referring to FIG. 9 and FIG. 10, FIG. 9, according to an embodiment of the disclosure, shows an illustrative partial plane view of a touch device, and FIG. 10, according to an embodiment of the disclosure, shows an illustrative cross-section of a touch device along the cross-section line 9-9' of FIG. 9. As shown in FIG. 9, the pattern of the conductive layer 116 can be designed into one strip or a plurality of strips. The structure of the embodiment of FIGS. 9-10 is almost the same as the embodiments of FIGS. 1-2. The difference between the embodiments of FIGS. 9-10 and FIGS. 1-2 is that the conductive layer 116 and the signal-conveying trace 112 in the embodiment of FIGS. 9-10 are formed from the same conductive material, such as a metal material, and in the same step. Therefore, as shown in FIG. 10, the conductive layer 116 and the signal-conveying trace 112 have a coplanar structure. In the embodiment, a vacant space S constituted between the decorative layer 110 and the sensing electrode layer 120 due to the difference in the thickness of the decorative layer 110 and the sensing electrode layer 120 is also filled with the insulating layer 114. The insulating layer 114 can be used as a buffer layer or a transition layer having the height required for the conductive layer 116 to straddle onto the decorative layer 110. Thus, the conductive layer 116 on the insulating layer 114 can be formed in a bridge style through the buffer function of the insulating layer 114.

Figure 11:
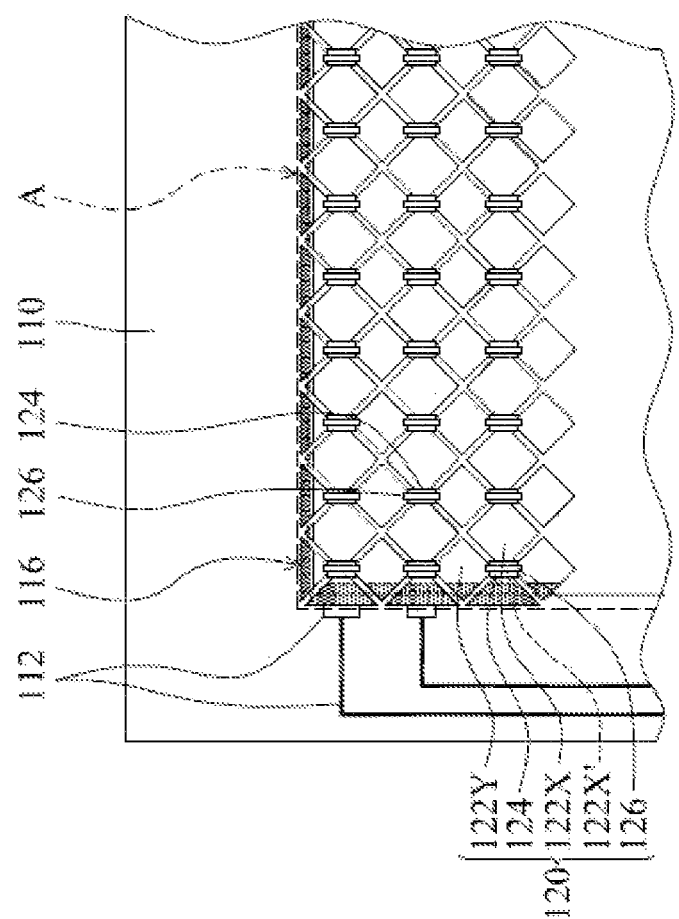
FIG. 11 shows an illustrative partial plane view of a touch device according to another embodiment of the present disclosure.

Referring to FIG. 11, an illustrative partial plane view of a touch device according to another embodiment of the present disclosure is shown. In the embodiment of FIG. 11, the pattern of the conductive layer 116 is designed into a circle surrounding the sensing electrode layer 120. The circle has a pattern design which is consistent with the pattern of the conductive units 122X and 122Y of the sensing electrode layer 120. The pattern of the conductive layer 116 extends from the border of the sensing electrode layer 120 and the decorative layer 110 to overlap with a portion of the decorative layer 110. A portion of the conductive layer 116 can be disposed above or under the signal-conveying trace 112. Moreover, an insulating layer (not shown) is further disposed under the conductive layer 116. The insulating layer can be used as a buffer layer or a transition layer having the height required for the conductive layer 116 to straddle onto the decorative layer 110. The insulating layer contributes to the straddling of the conductive layer 116 onto the decorative layer 110, such that the conductive layer 116 is not easily broken or damaged. The reliability of the electrical connection between the sensing electrode layer 120 and the signal-conveying trace 112 is thereby enhanced.

In the embodiment of FIG. 11, the conductive layer 116 can be formed from a transparent conductive material such as ITO. Since the pattern design of the circle of the conductive layer 116 is consistent with the pattern design of the conductive units 122X and 122Y of the sensing electrode layer 120, the touch-sensing active area A of the touch device of the embodiment can extend to a partial area of the decorative layer 110. Moreover, when the jumpers 126 of the sensing electrode layer 120 are formed from a transparent conductive material, the conductive layer 116 can be formed with the jumpers 126 together in the same step. Thus, there are no additional steps in the process, and the fabrication cost of the touch device is not increased.

In a summary of the above description, according to the embodiments of the disclosure, the vacant space constituted of the decorative layer and the sensing electrode layer is filled with the insulating layer. The insulating layer can be used as a buffer structure or a transition structure having the height required for the conductive layer to straddle onto the decorative layer. Thus, the conductive layer formed on the insulating layer can smoothly straddle from the sensing electrode layer onto the decorative layer for electrically connecting with the signal-conveying trace. The reliability of the electrical connection between the sensing electrode layer and the signal-conveying trace is thereby enhanced. Especially in the case of the white and the colored decorative layer with a thicker thickness than that of the black decorative layer, using the structure design of the insulating layer and the conductive layer of the embodiments of the disclosure can further enhance the reliability of the electrical connection between the sensing electrode layer and the signal-conveying trace.

Moreover, the insulating layer and the conductive layer of the embodiments of the disclosure can be completed using the original steps of the touch device. Thus, the fabrication of the insulating layer and the conductive layer of the embodiments of the disclosure does not add additional steps to the process or increase the fabrication cost.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch device, comprising: a sensing electrode layer; a decorative layer formed on at least one side of the sensing electrode layer and disposed for corresponding to the sensing electrode layer to constitute a vacant space; a signal-conveying trace disposed on the decorative layer; an insulating layer formed to fill the vacant space; and a conductive layer formed on the insulating layer and bridging over the sensing electrode layer and the decorative layer through the insulating layer for electrically connecting the sensing electrode layer with the signal-conveying trace; and wherein the conductive layer stretches over the signal-conveying trace.

2. The touch device of claim 1, wherein the decorative layer is adjacent to the sensing electrode layer or overlaps the sensing electrode layer.

3. A touch device, comprising: a sensing electrode layer; a decorative layer formed on at least one side of the sensing electrode layer and disposed for corresponding to the sensing electrode layer to constitute a vacant space; a signal-conveying trace disposed on the decorative layer; an insulating layer formed to fill the vacant space; and a conductive layer formed on the insulating layer and bridging over the sensing electrode layer and the decorative layer through the insulating layer for electrically connecting the sensing electrode layer with the signal-conveying trace wherein the conductive layer is disposed between the insulating layer and the signal-conveying trace and the signal-conveying trace stretches over the conductive layer.

4. The touch device of claim 1, wherein the material of the conductive layer comprises a metal or a transparent conductive material.

5. The touch device of claim 1, wherein the conductive layer has a pattern comprising one strip or a plurality of strips, and the strip has a shape of rectangle, dumbbell shape, S-shape, or combination thereof.

6. The touch device of claim 1, wherein the conductive layer has a pattern comprising a circle surrounding the sensing electrode layer and the circle has a pattern consistent with the pattern of the sensing electrode layer.

7. The touch device of claim 1, wherein the insulating layer comprises a single-layer or a multi-layer structure and the shape of the insulating layer comprises rectangle, circle, hexagon, octagon, or combination thereof.

8. The touch device of claim 1, further comprising: a protection cover, wherein the sensing electrode layer is disposed on one surface of the protection cover.

9. The touch device of claim 1, further comprising: a protection layer covering the sensing electrode layer, the decorative layer, the signal-conveying trace and the conductive layer.

10. The touch device of claim 1, wherein the conductive layer and the sensing electrode layer are integrally formed.

11. A method for fabricating a touch device, comprising: forming an insulating layer to fill a vacant space constituted by disposing a decorative layer to correspond to a sensing electrode layer; and forming a conductive layer on the insulating layer, wherein the conductive layer bridges over the sensing electrode layer and the decorative layer through the insulating layer for electrically connecting the sensing electrode layer with a signal-conveying trace formed on the decorative layer; and wherein the conductive layer stretches over the signal-conveying trace.

12. The method of claim 11, wherein the decorative layer adjacent to the sensing electrode layer or overlaps the sensing electrode layer.

13. The method of claim 11, wherein the conductive layer is formed before the step of forming the signal-conveying trace and the signal-conveying trace stretches over the conductive layer.

14. The method of claim 11, wherein the conductive layer is formed after the step of forming the signal-conveying trace, and the conductive layer stretches over the signal-conveying trace.

15. The method of claim 11, wherein the conductive layer and the signal-conveying trace are formed in the same step and the conductive layer and the signal-conveying trace are coplanar.

16. The method of claim 11, wherein the sensing electrode layer comprises a plurality of first sensing electrodes arranged along a first-axial direction, a plurality of second sensing electrodes arranged along a second-axial direction, and a plurality of electrical isolation structures, wherein each of the first sensing electrodes comprises a plurality of first conductive units and a plurality of connection lines for electrically connecting any two adjacent first conductive units in the first-axial direction, each of the second sensing electrodes comprises a plurality of second conductive units and a plurality of jumpers for electrically connecting any two adjacent second conductive units in the second-axial direction, the connection lines and the jumpers crisscross, and the electrical isolation structures are individually disposed between each of the connection lines and each of the jumpers.

17. The method of claim 16, wherein the conductive layer, the signal-conveying trace and the jumpers are formed of the same material, and the conductive layer, the signal-conveying trace and the jumpers are formed by the same process.

18. The method of claim 16, wherein the conductive layer and the jumpers are formed of the same material, and the conductive layer and the jumpers are formed by the same process.

19. The method of claim 16, wherein the conductive layer, the first sensing electrodes and the second sensing electrodes are formed of the same material, and the conductive layer, the first sensing electrodes and the second sensing electrodes are formed by the same process.

20. The method of claim 16, wherein the insulating layer and the electrical isolation structures are formed of the same material, and the insulating layer and the electrical isolation structures are formed by the same process.

21. The method of claim 11, wherein the sensing electrode layer is formed on one surface of a protection cover.

22. The method of claim 11, further comprising: forming a protection layer to cover the sensing electrode layer, the decorative layer, the signal-conveying trace and the conductive layer.

* * * * *